United States Patent
Sai

(10) Patent No.: US 9,465,294 B2
(45) Date of Patent: Oct. 11, 2016

(54) OPTICAL APPARATUS, PROJECTION OPTICAL SYSTEM, EXPOSURE APPARATUS, AND METHOD OF MANUFACTURING ARTICLE

(71) Applicant: CANON KABUSHIKI KAISHA, Tokyo (JP)

(72) Inventor: Choshoku Sai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 19 days.

(21) Appl. No.: 14/560,026

(22) Filed: Dec. 4, 2014

(65) Prior Publication Data
US 2015/0177481 A1    Jun. 25, 2015

(30) Foreign Application Priority Data
Dec. 25, 2013 (JP) ................. 2013-268090

(51) Int. Cl.
G03B 27/54 (2006.01)
G03F 7/20 (2006.01)
G02B 26/06 (2006.01)
G02B 26/08 (2006.01)

(52) U.S. Cl.
CPC ............ *G03F 7/2008* (2013.01); *G02B 26/06* (2013.01); *G02B 26/0825* (2013.01); *G03F 7/70266* (2013.01)

(58) Field of Classification Search
CPC .......... G03F 7/70058; G03F 7/70266; G02B 26/0858; G02B 7/183
USPC ................. 355/53, 67; 359/81–822
See application file for complete search history.

(56) References Cited

U.S. PATENT DOCUMENTS

| | | | |
|---|---|---|---|
| 6,840,638 B2 | 1/2005 | Watson | |
| 7,443,619 B2* | 10/2008 | Sakino | ........... G02B 7/183 359/819 |
| 7,907,326 B2* | 3/2011 | Uchida | ........ G02B 26/0825 359/291 |
| 2011/0299053 A1 | 12/2011 | Steinbach et al. | |

FOREIGN PATENT DOCUMENTS

| | | |
|---|---|---|
| JP | 2005004146 A | 1/2005 |
| TW | 200745651 A | 12/2007 |
| TW | 200807170 A | 2/2008 |

OTHER PUBLICATIONS

Office Action issued in TW103140484, mailed Nov. 23, 2015. English translation provided.

* cited by examiner

*Primary Examiner* — Hung Henry Nguyen
(74) *Attorney, Agent, or Firm* — Rossi, Kimms & McDowell LLP

(57) ABSTRACT

The present invention provides an optical apparatus that deforms a reflecting surface of a mirror, comprising a base plate, a fixing member configured to fix a part of the mirror including a center of the mirror to the base plate, and a plurality of actuators each having a first end connected to the mirror and a second end connected to the base plate, and configured to apply force to a back face of the mirror, wherein the plurality of actuators include a plurality of first actuators and a plurality of second actuators, and the plurality of first actuators are arranged such that a distance between each first actuator and the center of the mirror is longer than half of a distance between the center and a periphery of the mirror.

23 Claims, 7 Drawing Sheets

(a)

(b)

OPTICAL APPARATUS, PROJECTION OPTICAL SYSTEM, EXPOSURE APPARATUS, AND METHOD OF MANUFACTURING ARTICLE

BACKGROUND OF THE INVENTION

1. Field of the Invention

The present invention relates to an optical apparatus that deforms a reflecting surface of a mirror, a projection optical system and an exposure apparatus using the optical apparatus, and a method of manufacturing an article.

2. Description of the Related Art

In order to improve the resolution in an exposure apparatus used for manufacturing semiconductor devices or the like, there has been a demand for correcting an optical aberration in a projection optical system in the exposure apparatus. Japanese Patent Laid-Open No. 2005-4146 proposes an optical apparatus that corrects the optical aberration in the projection optical system by deforming a reflecting surface of a mirror included in the projection optical system.

In the optical apparatus described in Japanese Patent Laid-Open No. 2005-4146, the mirror is supported at its peripheral portion by a supporting member, and a plurality of passive actuators and a plurality of active actuators that apply force to the back face (the face on the opposite side of the reflecting surface) of the mirror are provided. The passive actuators are used to correct a mirror shape error with a small shape fluctuation relative to the lapse of time, such as an error caused by a process or assembly of the mirror. On the other hand, the active actuators are used to correct a mirror shape error with a large shape fluctuation relative to the lapse of time, such as an error caused during a time period during which a single substrate is exposed.

Since there is a demand that the exposure apparatus accurately corrects the optical aberration in the projection optical system in real time, the optical apparatus needs to rapidly and accurately deform the reflecting surface of the mirror used in the projection optical system. In order to realize this, the deformation amount of the reflecting surface of the mirror (the sensitivity of the mirror) relative to driving of the actuators may be small, and that drive control can be easily performed. The present inventors have found that, in an optical apparatus in which the center portion of the mirror is fixed to a base plate by a fixing member, the sensitivity of the mirror can be reduced by arranging actuators whose deformation amount at the time of receiving a unit amount of external force is small (i.e., that have a high rigidity), at positions distant from the center of the mirror. The idea of thus reducing the sensitivity of the mirror is not described in Japanese Patent Laid-Open No. 2005-4146.

SUMMARY OF THE INVENTION

The present invention provides an optical apparatus that is advantageous in rapidly and accurately deforming a reflecting surface of a mirror, for example.

According to one aspect of the present invention, there is provided an optical apparatus that deforms a reflecting surface of a mirror, comprising: a base plate; a fixing member configured to fix a part of the mirror including a center of the mirror to the base plate; and a plurality of actuators each having a first end connected to the mirror and a second end connected to the base plate, and configured to apply force to a back face on the opposite side of the reflecting surface, wherein the plurality of actuators include a plurality of first actuators and a plurality of second actuators, a distance between the first end and the second end of the second actuator changes greater than that of the first actuator when receiving a unit amount of external force, and the plurality of first actuators are arranged such that a distance between each first actuator and the center of the mirror is longer than half of a distance between the center of the mirror and a periphery of the mirror.

Further features of the present invention will become apparent from the following description of exemplary embodiments with reference to the attached drawings.

DESCRIPTION OF THE EMBODIMENTS

Figure 1A:
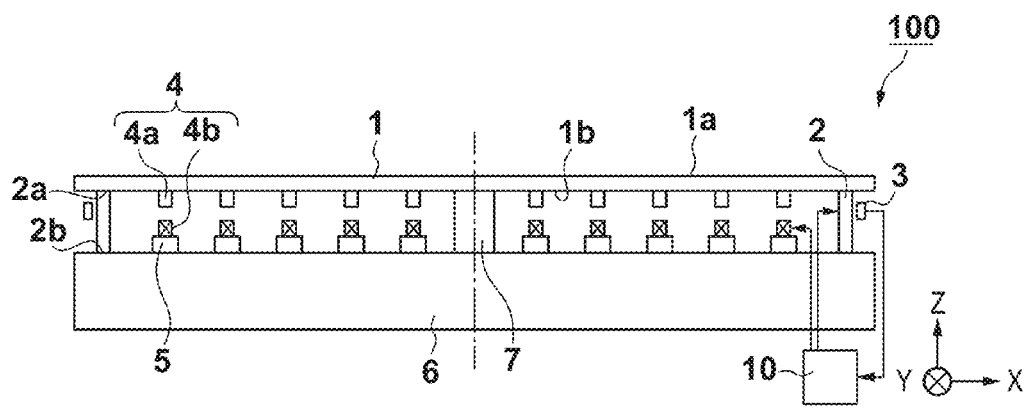
FIG. 1A is a schematic diagram showing an exemplary configuration of an optical apparatus in a first embodiment.

Exemplary embodiments of the present invention will be described in detail in accordance with the accompanying drawings. Note that the same reference numerals denote the same members throughout the drawings, and a repetitive description thereof will not be given.

First Embodiment

An optical apparatus 100 in a first embodiment will be described with reference to FIG. 1. FIG. 1A is a crosssectional view showing the optical apparatus 100 in the first embodiment. The optical apparatus 100 in the first embodiment corrects an optical aberration in a projection optical system by deforming a reflecting surface 1a of a mirror 1 included in the projection optical system in an exposure apparatus, for example. The optical apparatus 100 in the first embodiment may include a base plate 6, a fixing member 7, a plurality of actuators, a plurality of displacement sensors 3, and a control unit 10.

The mirror 1 has the reflecting surface 1a that reflects light, and a back face 1b that is a face on the opposite side of the reflecting surface 1a, and a part (hereinafter, a center portion) of the mirror 1 including the center of the mirror 1 is fixed to the base plate 6 by the fixing member 7. The center portion of the mirror 1 is thus fixed to the base plate 6 because the center portion of the mirror 1 used in the projection optical system in the exposure apparatus is often not irradiated with light, and it is hardly necessary to deform the center portion of the mirror 1.

Each of the actuators has a first end connected to the mirror 1 and a second end connected to the base plate 6, and applies force to the back face 1b of the mirror 1. The actuators include a plurality of first actuators 2 and a plurality of second actuators 4, and the distance between the first end and the second end of each second actuator 4 changes greater than that of each first actuator 1 when receiving a unit amount of external force. A change of the distance between the first end and the second end when receiving a unit amount of external force will be hereinafter referred to as "rigidity".

Figure 1B:
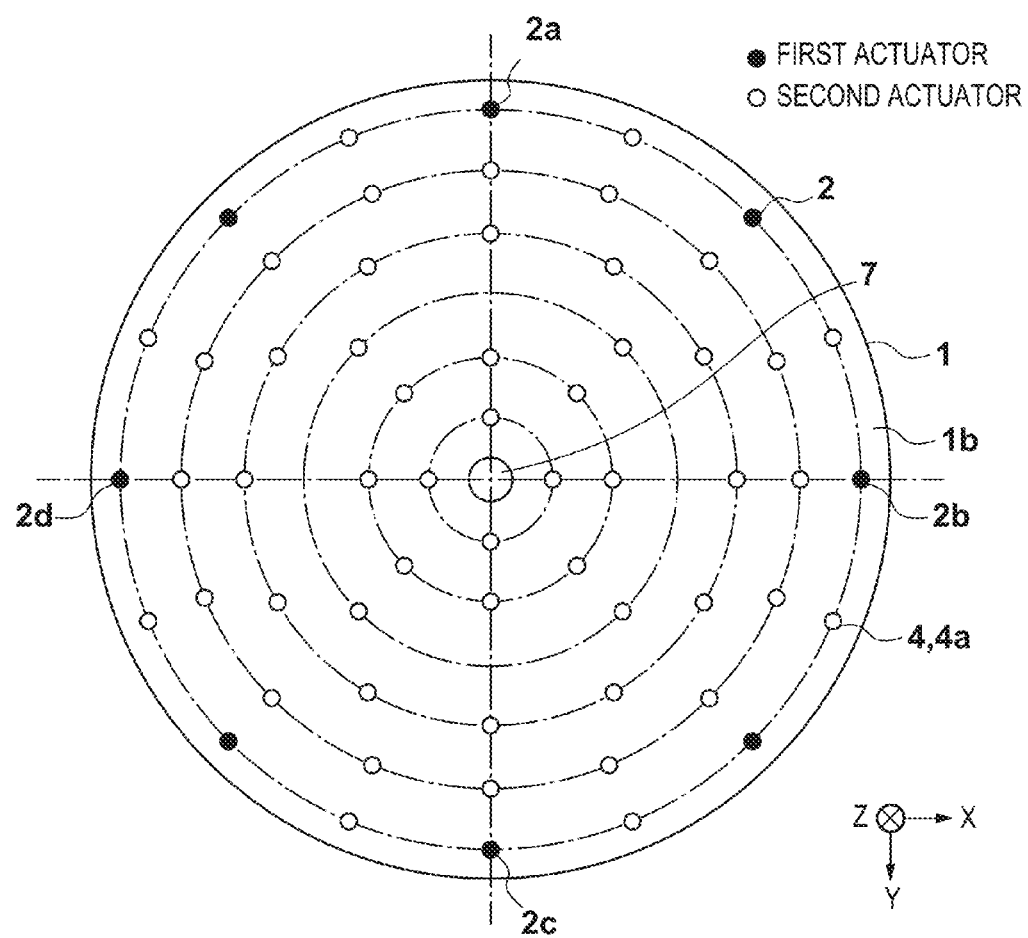
FIG. 1B is a diagram showing an exemplary arrangement of a plurality of actuators in the optical apparatus in the first embodiment.
Figure 2:
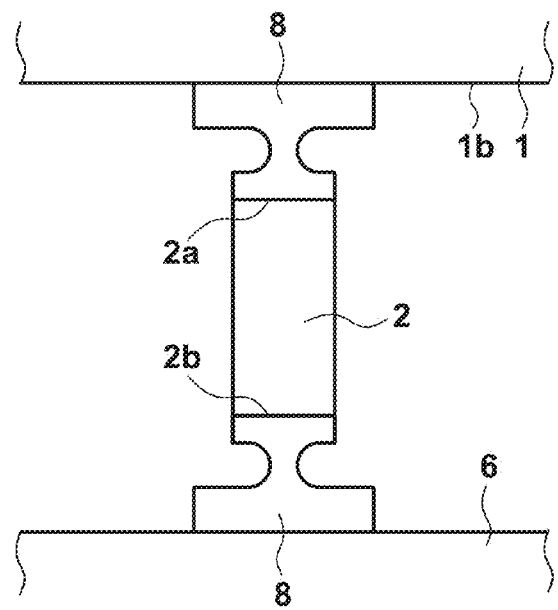
FIG. 2 is a schematic diagram showing a configuration in which a first actuator is connected to a mirror and a base plate via hinge members.

The first actuators 2 are arranged between the mirror 1 and the base plate 6, and apply force to an area (hereinafter, an outer region) that is outward of the intermediate position between the center of the mirror 1 and the periphery of the mirror 1. Each first actuator 2 has a first end 2a connected to the back face 1b of the mirror 1 and a second end 2b connected to the base plate 6, and deforms so as to change the distance between the first end 2a and the second end 2b. Force can thereby be applied to the portion of the back face 1b to which the first end 2a is connected. The first actuators 2 may be actuators having a high rigidity, such as piezoelectric actuators, magnetostrictive actuators, or electric screw members, for example. Here, although the first end 2a of each first actuator 2 and the back face 1b of the mirror 1 are directly connected to each other, and the second end 2b and the base plate 6 are directly connected to each other in FIG. 1, the invention is not limited thereto. The first end 2a of each first actuator 2 and the back face 1b of the mirror 1 may be connected via an elastic body, a rigid body, or the like, and the second end 2b and the base plate 6 may be connected via an elastic body, a rigid body, or the like. For example, as shown in FIG. 2, the first end 2a of each first actuator 2 and the back face 1b of the mirror 1 may be connected via a hinge member 8. The second end 2b of each first actuator 2 and the base plate 6 may also be connected via a hinge member 8. As a result of thus using the hinge members 8, the driving force of the first actuators 2 can be efficiently transferred to the back face 1b of the mirror 1, almost without generating other components that cause a shape error of the mirror 1.

Each of the displacement sensors 3 is provided in the vicinity of the corresponding first actuator 2, and detects displacement between the first end 2a and the second end 2b of the first actuator 2. The displacement between the first end 2a and the second end 2b of each first actuator 2 will be hereinafter referred to as "driving displacement". As a result of thus providing the displacement sensors 3, feedback control of the first actuators 2 can be performed based on the driving displacement of the first actuators 2 detected by the respective displacement sensors 3. For example, in the case of using piezoelectric actuators as the first actuators 2, a hysteresis occurs with the piezoelectric actuator, and accordingly there are cases where driving displacement corresponding to a command value (voltage) cannot be obtained with the piezoelectric actuators. For this reason, the optical apparatus 100 may be provided with sensors for detecting information indicating driving status of each of the first actuators 2. In the first embodiment, the displacement sensors 3 are used as the aforementioned sensors, and the driving displacement of the first actuators 2 is detected as the information indicating the driving status. In the case of using piezoelectric actuators as the first actuators 2, each piezoelectric actuator is subjected to feedback control using a command value based on a difference between the driving displacement detected by the displacement sensors 3 (i.e., output of the displacement sensors 3) and target displacement.

Here, although the optical apparatus 100 in the first embodiment is provided with the displacement sensors 3 as the sensors for detecting information indicating the driving status of the first actuators 2, the invention is not limited thereto. For example, force sensors for detecting the driving force of the first actuators 2 may be provided in place of the displacement sensors 3. The force sensors may be arranged between the first end 2a of each first actuator 2 and the back face 1b of the mirror 1, or between the second end 2b and the base plate 6. The force sensors detect the force that the first actuators 2 apply to the back face 1b of the mirror 1, i.e., the driving force of the first actuators 2, as the information indicating the driving status of the first actuators 2. In the case of thus providing the force sensors, the first actuators 2 are subjected to feedback control based on the driving force detected by the force sensors.

In this manner, the first actuators 2 need to be provided with sensors for detecting information indicating their driving status, and the first actuators 2 are controlled based on the output from these sensors. For this reason, the number of first actuators 2 may be reduced as much as possible, in terms of the cost and the complexity of the control of the actuators when deforming the reflecting surface 1a of the mirror 1. In the optical apparatus 100 in the first embodiment, a plurality of second actuators 4, the rigidity of which is lower than that of the first actuators 2 and the number of which is larger than that of the first actuators 2, are used in addition to the first actuators 2.

The second actuators 4 are arranged between the mirror 1 and the base plate 6, and apply force to the back face 1b of the mirror 1. Actuators having a lower rigidity than that of the first actuators 2 are used as the second actuators 4. For example, non-contact actuators (linear motors, electrostatic actuators, electromagnets, etc.) each including a movable element 4a and a stator 4b that do not come into contact with each other may be used as the second actuators 4. One (that includes the first end) of the movable element 4a and the stator 4b is fixed to the base plate 6, and the other (that includes the second end) is fixed to the back face 1b of the mirror 1. In the first embodiment, the movable element 4a is fixed to the back face 1b of the mirror 1, and the stator 4b is fixed to the base plate 6 via a member 5. The second actuators 4 can thereby apply force to the back face 1b of the mirror 1 and change the distance between the mirror 1 and the base plate 6. Here, unlike the first actuators 2, the second actuators 4 do not need to be provided with sensors (e.g., displacement sensors) for detecting information indicating the driving status of the second actuators 4. This is because a hysteresis is not likely to occur with the non-contact actuators used as the second actuators 4, and driving displacement corresponding to a command value (current or voltage) for the second actuators 4 can be obtained. That is to say, it is because feedback control does not need to be performed on the second actuators 4, using a result of detection by displacement sensors. The second actuators 4 may also be configured to include an actuator having a high rigidity, such as one used as the first actuators 2, and an elastic body (a coil spring, a flat spring, etc.) connected thereto in series.

Figure 3:
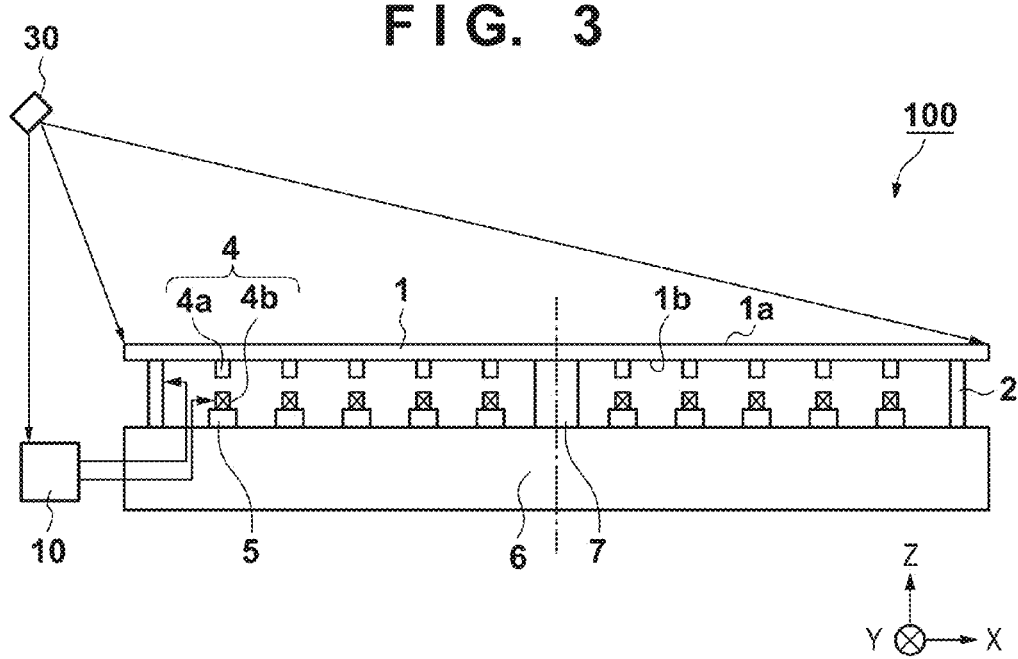
FIG. 3 is a schematic diagram showing an exemplary configuration of the optical apparatus in the first embodiment.

The control unit 10 has a CPU, a memory, and the like, and performs feedback control on driving of the first actuators 2 and driving of the second actuators 4, based on a deviation between the shape of the reflecting surface 1a of the mirror 1 and a target shape. For example, the shape of the reflecting surface 1a of the mirror 1 may be calculated based on a result of detection by the displacement sensors 3 provided for the respective first actuators 2, or a measurement unit 30 for measuring the shape of the reflecting surface 1a of the mirror 1 may be used as shown in FIG. 3, and the shape of the reflecting surface 1a of the mirror 1 may be acquired from a measurement result thereof. The measurement unit 30 may be, for example, an interferometer, a Shack-Hartmann sensor, or the like. In the case of using the measurement unit 30, the displacement sensors 3 do not have to be provided. The target shape may be determined such that the optical aberration in the projection optical system that includes the optical apparatus 100 is within an allowable range.

Next, a description will be given of an arrangement of the first actuators 2 and the second actuators 4 in the optical apparatus 100 in the first embodiment, with reference to FIG. 1B. FIG. 1B is a diagram showing an exemplary arrangement of the actuators in the optical apparatus 100 in the first embodiment. In FIG. 1B, black circles denote the first actuators 2, and while circles denote the second actuators 4.

In an exposure apparatus, since there is a demand for accurately correcting the optical aberration in the projection optical system in real time, the reflecting surface 1a of the mirror 1 in the optical apparatus may be deformed rapidly and accurately. In the optical apparatus 100 in the first embodiment, actuators having a relatively high response speed, such as piezoelectric actuators or magnetostrictive actuators, are used as the first actuators 2. Also, actuators having a relatively high response speed, such as linear motors, electrostatic actuators, or electromagnets, are used as the second actuators 4. The first actuators 2 and the second actuators 4 are controlled by the control unit 10 such that the shape of the reflecting surface 1a of the mirror 1 is brought close to the target shape. It is thereby possible to realize rapid deformation of the reflecting surface 1a of the mirror 1.

Meanwhile, in order to accurately deform the reflecting surface 1a of the mirror 1, the sensitivity of the reflecting surface 1a of the mirror 1 (hereinafter, sensitivity of the mirror 1) relative to the driving of the actuators (the first actuators 2 or the second actuators 4) may be reduced. The sensitivity of the mirror 1 is the amount of deformation that the reflecting surface 1b of the mirror 1 undergoes when the actuators are driven by a predetermined amount, for example, and in the case of using a thin mirror having a large aperture as the mirror 1, the sensitivity of the mirror 1 may be larger as the aperture is larger and the thickness is smaller. For this reason, a very high driving resolution is required in order to accurately deform the mirror 1, which results in difficulty in drive control. Furthermore, actuators having a very large ratio (usually called a dynamic range) between the driving range and the driving resolution of the actuators are required, and it can also be considered that actuators having such a large dynamic range cannot be manufactured. Accordingly, particularly in the case of using a thin mirror having a large aperture as the mirror 1, it is desirable to reduce the sensitivity of the mirror 1. By thus reducing the sensitivity of the mirror 1, for example, the first actuators 2 and the second actuators 4 can be easily controlled when causing the reflecting surface 1a of the mirror 1 to slightly deform. Furthermore, by reducing the sensitivity of the mirror 1, even if an error occurs in the driving force of the actuators, deformation of the reflecting surface 1a of the mirror 1 relative to this error in the driving force can be reduced. For this reason, in the optical apparatus 100 in the first embodiment, the first actuators 2 and the second actuators 4 are arranged so as to reduce the sensitivity of the mirror 1. Here, a description will be given of results of analyzing the sensitivity of the mirror 1 relative to the arrangements of the first actuators 2 and the second actuators 4, with reference to FIGS. 4A to 7D.

The results of analyzing the sensitivity of the mirror 1 will be described below, using three analysis models 1 to 3 with different arrangements of the first actuators 2 and the second actuators 4. Specifications of the mirror 1 and the parts of the optical apparatus 100 used in the analysis of the sensitivity of the mirror 1 are as shown in Table 1. In Table 1, piezoelectric actuators are used as the first actuators 2, and linear motors are each constituted by a magnet of the movable element 4a and a coil of the stator 4b arranged so as to face the magnet via a gap, and are used as the second actuators 4. In the analysis of the sensitivity of the mirror 1, the positions where the actuators (the first actuators 2 or the second actuators 4) are arranged are the same in the three analysis models 1 to 3. In the analysis models 1 to 3, as shown in Table 2, eight actuators are arranged at first positions that are separated from the center of the mirror 1 by the distance of $D_3/2$, 16 actuators are arranged at second positions that are separated therefrom by the distance of $D_4/2$, and 16 actuators are arranged at third positions that are separated therefrom by the distance of $D_5/2$.

TABLE 1

| | Material | Diameter | Thickness, or height |
|---|---|---|---|
| Mirror | Quartz | $D_2$ = 300 mm | $t_1$ = 3 mm |
| Fixign member | IC-362A | $D_1$ = 30 mm | $t_2$ = 20 mm |
| Base plate | IC-362A | $D_2$ = 300 mm | $t_3$ = 10 mm |
| Magnet | Neodymium | d = 10 mm | $t_4$ = 6 mm |
| Piezoelectric actuator | Electrostatic ceramics | d = 10 mm | $t_2$ = 20 mm |

TABLE 2

| First position | D3 = 60 mm | 8 |
|---|---|---|
| Second position | D4 = 170 mm | 16 |
| Third position | D5 = 280 mm | 16 |

Figure 4A:
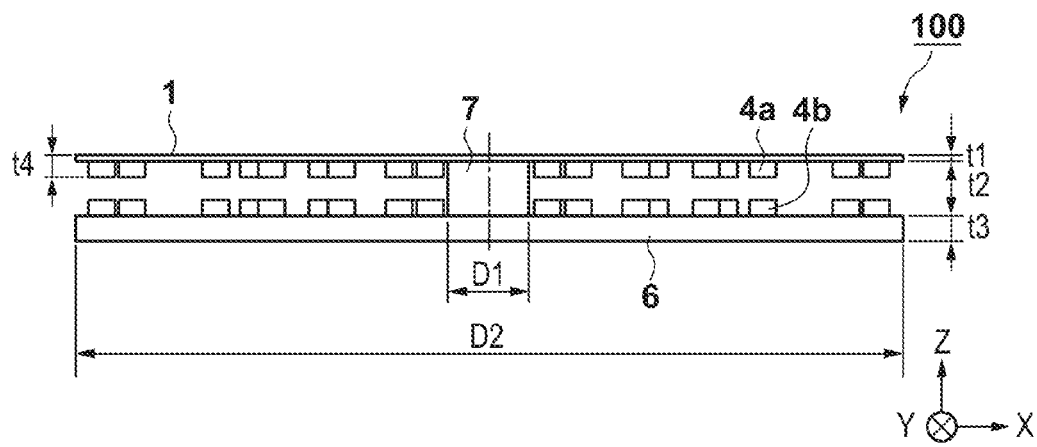
FIG. 4A is a diagram showing an analysis model 1 related to an arrangement of first actuators and second actuators.
Figure 4B:
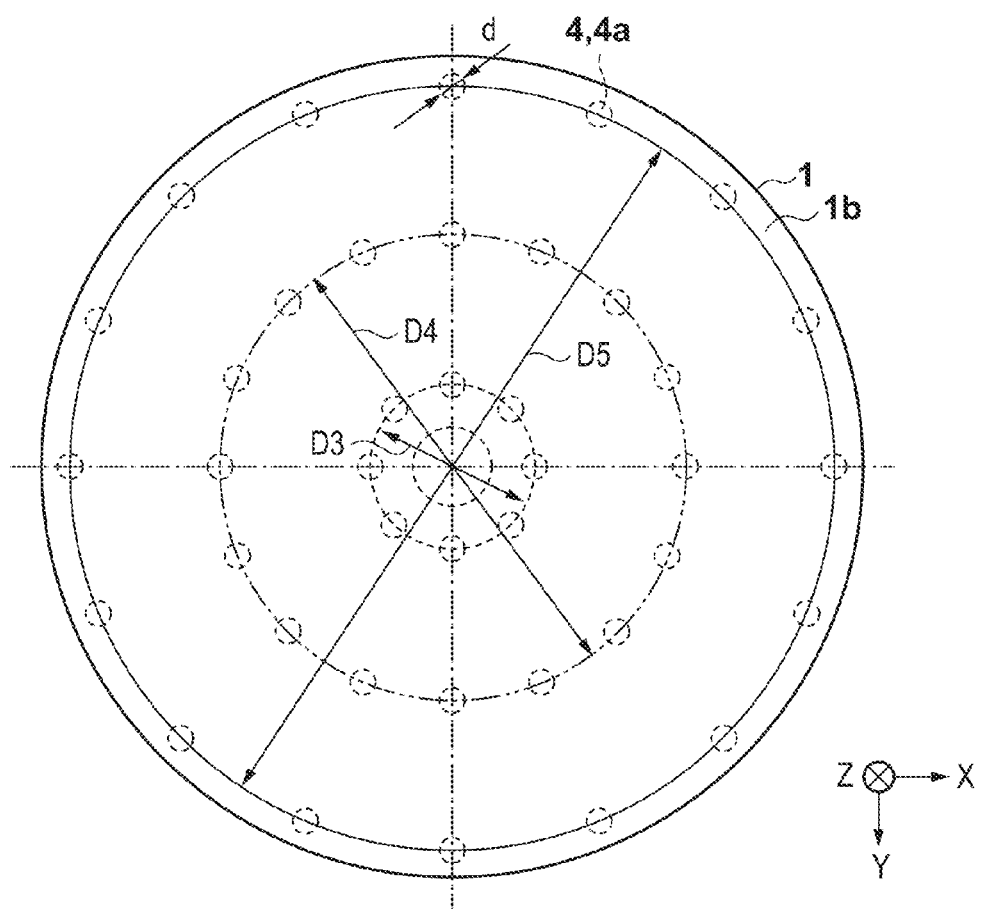
FIG. 4B is a diagram showing the analysis model 1 related to an arrangement of the first actuators and the second actuators.
Figure 5A:
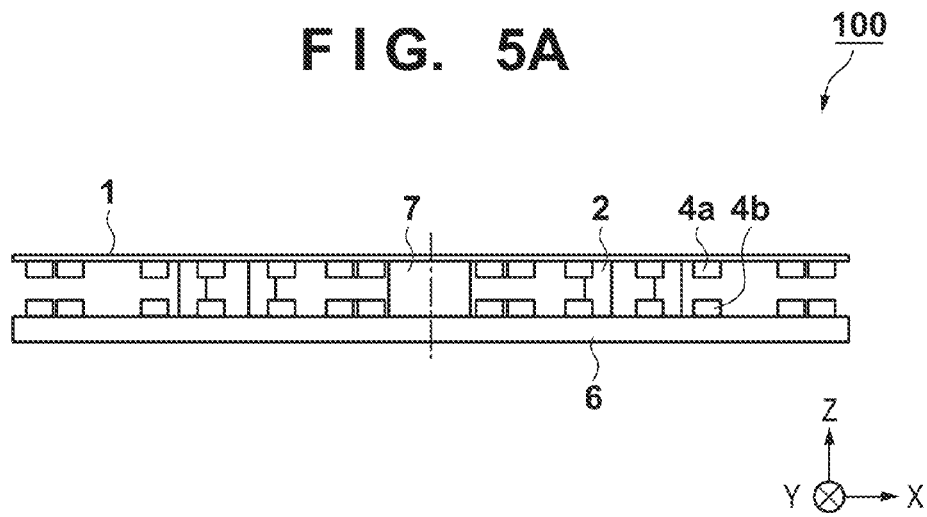
FIG. 5A is a diagram showing an analysis model 2 related to an arrangement of the first actuators and the second actuators.
Figure 5B:
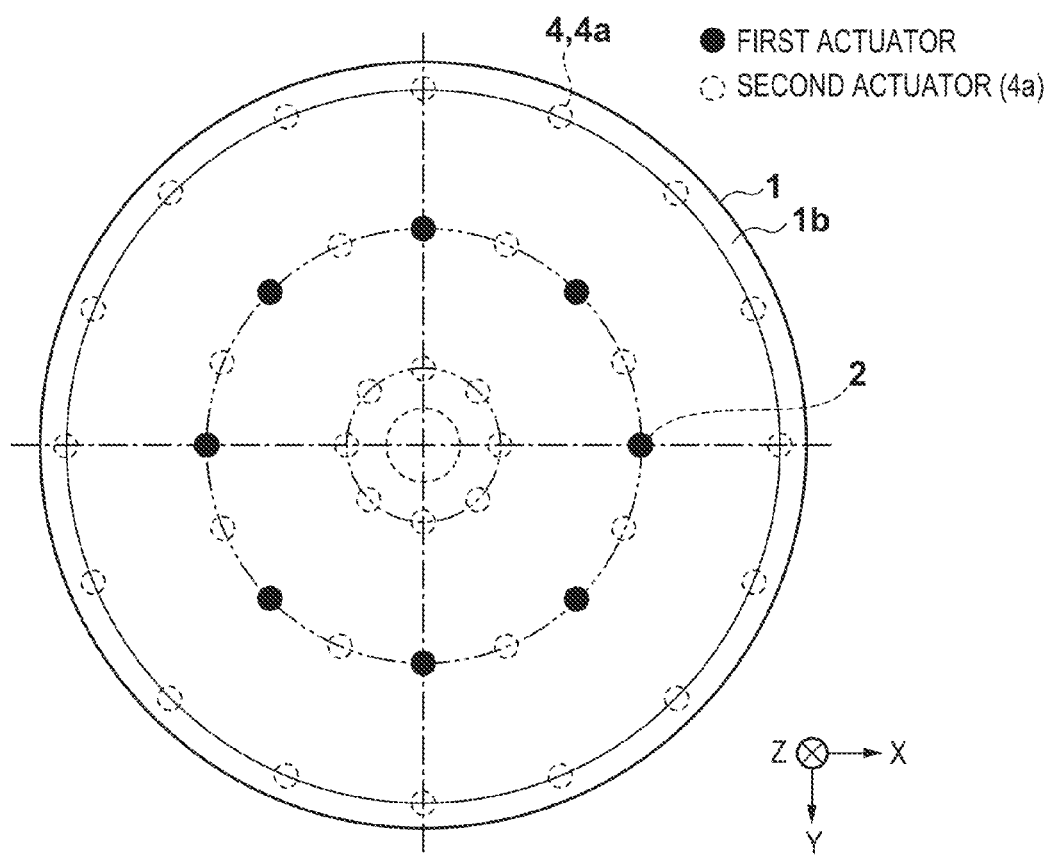
FIG. 5B is a diagram showing the analysis model 2 related to an arrangement of the first actuators and the second actuators.
Figure 6A:
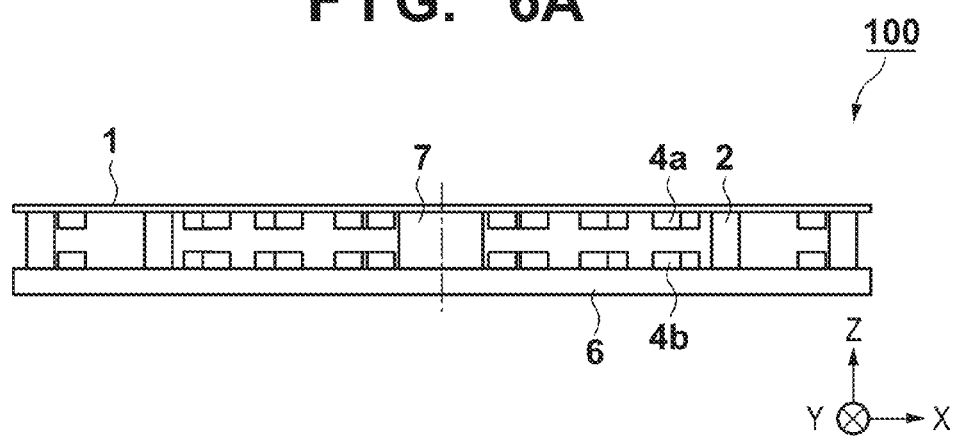
FIG. 6A is a diagram showing an analysis model 3 related to an arrangement of the first actuators and the second actuators.
Figure 6B:
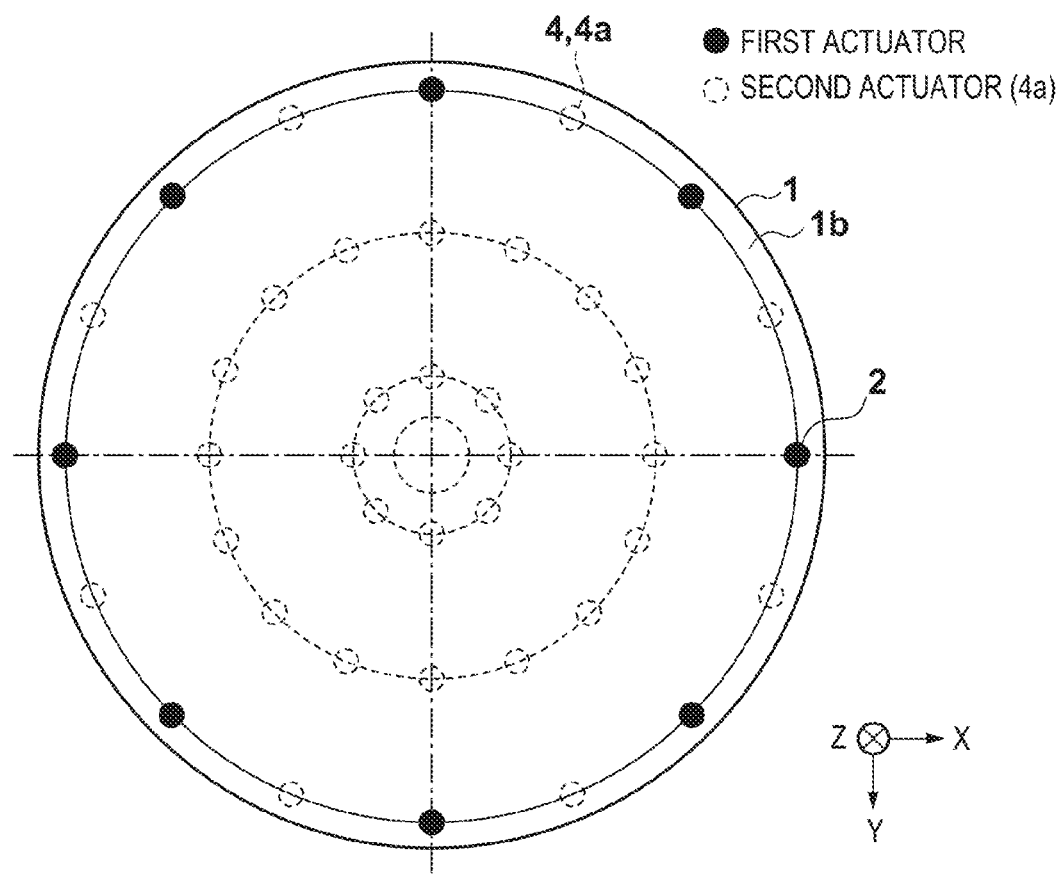
FIG. 6B is a diagram showing the analysis model 3 related to an arrangement of the first actuators and the second actuators.

First, the three analysis models 1 to 3 will be described with reference to FIGS. 4A to 6B. FIGS. 4A and 4B are diagrams showing the analysis model 1, in which the first actuators 2 are not used and only the second actuators 4 are arranged. FIG. 4A is a diagram showing the analysis model 1 as seen from the side (in the y direction), and FIG. 4B is a diagram showing the arrangement of the second actuators 4 in the analysis model 1. FIGS. 5A and 5B are diagrams showing the analysis model 2, in which eight first actuators 2 are arranged at equal intervals at the second positions 12. FIG. 5A is a diagram showing the analysis model 2 as seen from the side (in the y direction), and FIG. 5B is a diagram showing the arrangement of the first actuators 2 and the second actuators 4 in the analysis model 2. FIGS. 6A and 6B are diagrams showing the analysis model 3, in which eight first actuators 2 are arranged at equal intervals at the third positions 13. FIG. 6A is a diagram showing the analysis model 3 as seen from the side (in the y direction), and FIG. 6B is a diagram showing the arrangement of the first actuators 2 and the second actuators 4 in the analysis model 3.

Figure 7A:
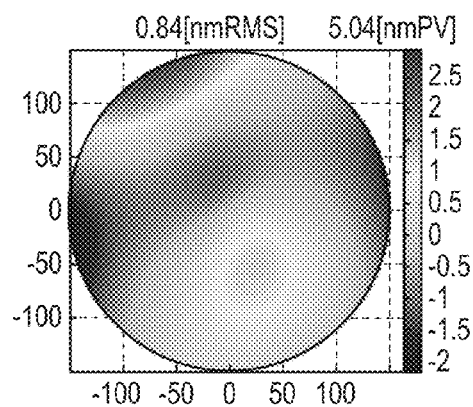
FIG. 7A is a diagram showing a result of analysis of the sensitivity of the mirror in the analysis model 1.
Figure 7B:
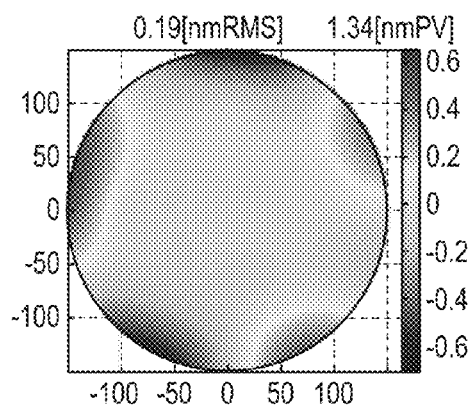
FIG. 7B is a diagram showing a result of analysis of the sensitivity of the mirror in the analysis model 2.
Figure 7C:
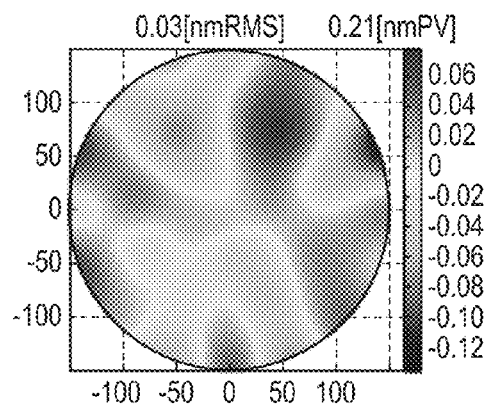
FIG. 7C is a diagram showing a result of analysis of the sensitivity of the mirror in the analysis model 3.
Figure 7D:
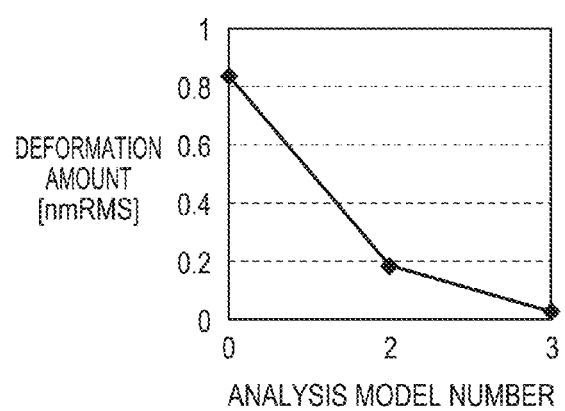
FIG. 7D is a diagram showing a relationship between the analysis models 1 to 3 and the deformation amount of a reflecting surface.

Next, results of analysis of the sensitivity of the mirror 1 in the analysis models 1 to 3 will be described with reference to FIGS. 7A to 7D. FIGS. 7A to 7D are diagrams showing results of analyzing, as the sensitivity of the mirror 1, the deformation amount of the reflecting surface 1a of the mirror 1 in the case where an error of 1 mN occurs in the driving force of the actuators (the first actuators 2 or the second actuators 4). FIG. 7A is a diagram showing the deformation amount of the reflecting surface 1a in the analysis model 1, FIG. 7B is a diagram showing the deformation amount of the reflecting surface 1a in the analysis model 2, and FIG. 7C is a diagram showing the deformation amount of the reflecting surface 1a in the analysis model 3. FIG. 7D is a diagram showing a relationship between the analysis models 1 to 3 and the deformation amount of the reflecting surface 1a. As shown in FIGS. 7A to 7D, the deformation amount of the reflecting surface 1a in the analysis model 1 is 0.84 nmRMS, while the deformation amount of the reflecting surface 1a in the analysis model 2 decreases to 0.19 nmRMS, and the deformation amount of the reflecting surface 1a in the analysis model 3 further decreases to 0.03 nmRMS. That is to say, in the analysis model 3, the deformation amount of the reflecting surface 1a can be reduced to 3.6% of that in the analysis model 1. This means that, in the optical apparatus 100 in which the center portion of the mirror 1 is fixed to the base plate 6 by the fixing member 7, the rigidity of the mirror 1 is smaller in a portion closer to the periphery of the mirror 1, and the mirror 1 may sensitively deform in response to a small error in the driving force of the actuators.

According to the above analysis results, in the optical apparatus 100 in the first embodiment in which the center portion of the mirror 1 is fixed, the first actuators 2 having a high rigidity may be arranged so as to apply force to the outer region in the back face 1b of the mirror 1. That is to say, the first actuators 2 may be arranged such that the distance between each first actuator 2 and the center of the mirror 1 is longer than half of the distance between the center of the mirror 1 and the periphery of the mirror 1. At this time, the first actuators 2 may be arranged close to the periphery of the mirror 1 where the sensitivity to the driving force of the actuators is largest. For example, the first actuators 2 may be arranged such that the ratio of the distance between each first actuator 2 and the center of the mirror 1 to the distance between the center of the mirror 1 and the periphery of the mirror 1 is 90% or larger. Also, the first actuators 2 may be arranged such that the distance between each first actuator 2 and the center of the mirror 1 is larger than or equal to the largest value among the distances between the respective second actuators 4 and the center of the mirror 1. For example, the second actuators 4 may be arranged inward of the first actuators 2 (on the side of the center of the mirror 1) such that a portion of the reflecting surface 1a of the mirror 1 that is irradiated with light for exposing a substrate deforms due to the second actuators 4.

Here, in order to correct an error including a $2\theta$ component that may frequently occur in the reflecting surface 1b of the mirror 1, four first actuators 2a to 2d among the first actuators 2 may be arranged at an equal angular interval relative to the center of the mirror 1, as shown in FIG. 1B. That is to say, the four first actuators 2a to 2d may be arranged such that the angle (angular interval) formed by two adjoining first actuators 2 and the center of the mirror 1 is 90 degrees. Also, the first actuators 2 may be arranged such that the distances between the respective first actuators 2 and the center of the mirror 1 are equal to one another. Since the masses of the mirror 1 held by the respective first actuators 2 can thereby be made almost equal to one another, it is easier to control the driving of the first actuators 2 and the driving of the second actuators 4 such that the shape of the reflecting surface 1b of the mirror 1 is brought close to the target shape. On the other hand, the first actuators 2 may also be arranged such that the ratios of the distances between the respective first actuators 2 and the center of the mirror 1 to the distance between the center of the mirror 1 and the periphery of the mirror 1 are equal to one another. This is effective when the shape of the mirror 1 is not a circle, as in the case of a square shape, for example.

As described above, the optical apparatus 100 in the first embodiment includes the plurality of first actuators 2 and the plurality of second actuators 4, in order to apply force to the back face 1b of the mirror 1 whose center portion is fixed to the base plate 6 by the fixing member 7. The first actuators 2 have a higher rigidity than that of the second actuators 4, and are arranged such that the distance between each first actuator 2 and the center of the mirror 1 is larger than or equal to the largest value among the distances between the respective second actuators 4 and the center of the mirror 1. Furthermore, the first actuators 2 may be arranged so as to apply force to the outer region of the back face 1b of the mirror 1. The control unit 10 controls the first actuators 2 and the second actuators 4, based on a deviation between the shape of the reflecting surface 1a of the mirror 1 and the target shape. The optical apparatus 100 can thereby rapidly and accurately deform the shape of the reflecting surface 1a of the mirror 1.

Figure 8:
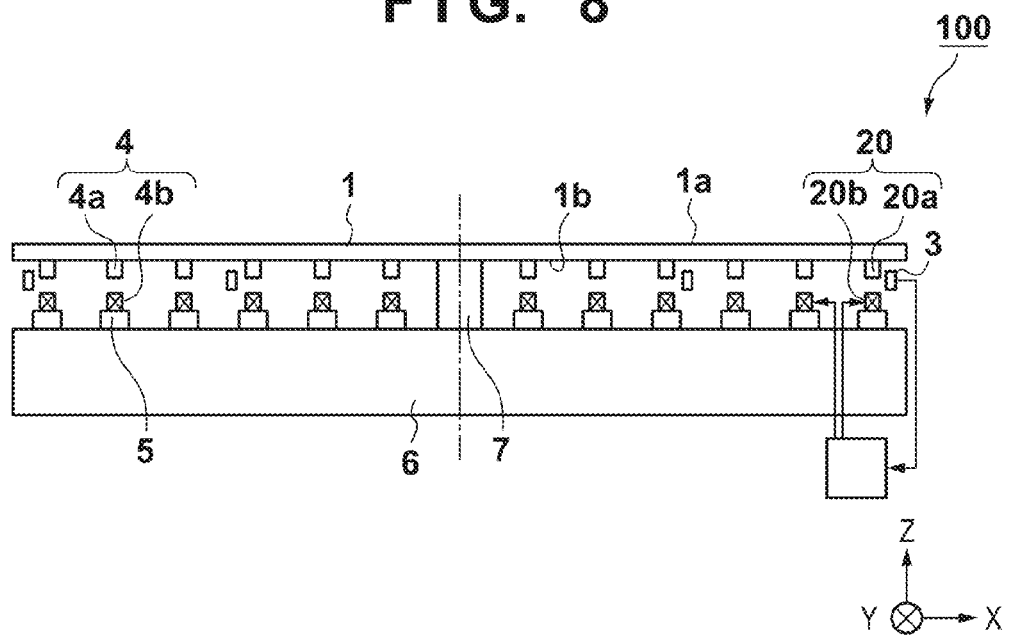
FIG. 8 is a schematic diagram showing an exemplary configuration of an optical apparatus in the first embodiment.

Here, although actuators having a higher rigidity than that of the second actuators 4, such as piezoelectric actuators or magnetostrictive actuators, are used as the first actuators 2 in the optical apparatus 100 in the first embodiment, the invention is not limited thereto. For example, as shown in FIG. 8, the first actuators 2 may be actuators 20 of the same type as the second actuators 4, i.e., actuators each having a movable element 20a and a stator 20b that do not come into contact with each other, such as linear motors, electrostatic actuators, or electromagnets. In this case, servo control is performed on the amount of displacement of each actuator 20, based on the output from displacement sensors 3 provided in the vicinity of the actuators 20 serving as the first actuators 2. Servo rigidity is thereby added to the first actuators 2, and the first actuators 2 show characteristics as if their mechanical rigidity increases. The rigidity of the first actuators 2 can be thus made higher than the rigidity of the second actuators 4, and an effect similar to that in the case of using piezoelectric actuators, magnetostrictive actuators, or the like as the first actuators 2 can be obtained.

Embodiment of Exposure Apparatus

The exposure apparatus in the present embodiment will be described with reference to FIG. 9. An exposure apparatus 50 in the present embodiment may include an illumination optical system IL, a projection optical system PO, a mask stage MS capable of holding and moving a mask 55, and a substrate stage WS capable of holding and moving a substrate 56. The exposure apparatus 50 may also include a control unit 51 that controls processing for exposing the substrate 56.

The light emitted from a light source (not shown) included in the illumination optical system IL can form, for example, an arc-shaped illuminated region elongated in the y direction on the mask 55, using a slit (not shown) included in the illumination optical system IL. The mask 55 and the substrate 56 are held respectively by the mask stage MS and the substrate stage WS, and are arranged at almost optically conjugate positions (positions of an object surface and an image surface of the projection optical system PO) via the projection optical system PO. The projection optical system PO has a predetermined projection magnification (e.g., ½ times), and projects a pattern formed on the mask 55 onto the substrate 56. The mask stage MS and the substrate stage WS are scanned in a direction (e.g., the x direction) parallel with the object surface of the projection optical system PO, at a speed ratio corresponding to the projection magnification of the projection optical system PO. The pattern formed on the mask 55 can thereby be transferred to the substrate 56.

Figure 9:
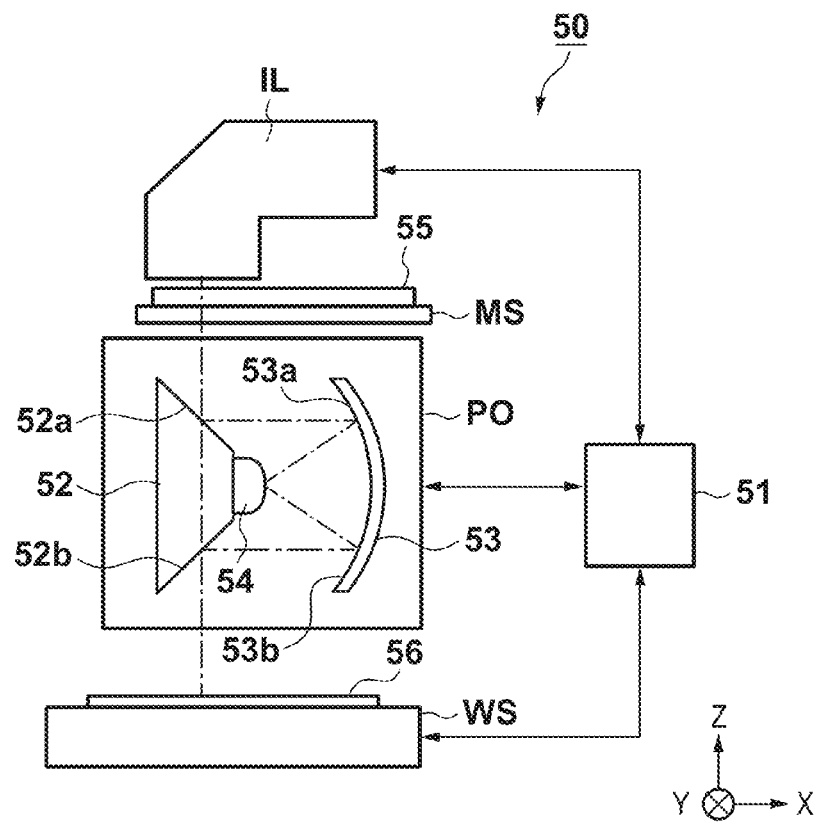
FIG. 9 is a schematic diagram showing an exemplary configuration of an exposure apparatus.

The projection optical system PO may be configured to include a flat mirror 52, a concave mirror 53, and a convex mirror 54 as shown in FIG. 9, for example. The light path of exposure light emitted from the illumination optical system IL and transmitted through the mask 55 is bent by a first face 52a of the flat mirror 52, and enters a first face 53a of the concave mirror 53. The exposure light reflected at the first face 53a of the concave mirror 53 is reflected at the convex mirror 54, and enters a second face 53b of the concave mirror 53. The light path of the exposure light reflected at the second face 53b of the concave mirror 53 is bent by a second face 52b of the flat mirror 52, and forms an image on the substrate. In the projection optical system PO configured as described above, the surface of the convex mirror 54 is an optical pupil.

In the above-described configuration of the exposure apparatus 50, the optical apparatus 100 in the first embodiment may be used as an apparatus for deforming the reflecting surface of the concave mirror 53 serving as the mirror 1, for example. As a result of using the optical apparatus 100 in the first embodiment in the exposure apparatus 50, it is possible to rapidly and accurately deform the reflecting surfaces (the first face 53a and the second face 53b) of the concave mirror 53, and to accurately correct an optical aberration in the projection optical system PO in real time. Here, the control unit 51 in the exposure apparatus 50 may be configured to include the control unit 10 for controlling the actuators in the optical apparatus 100.

<Embodiment of Method of Manufacturing Article>

A method of manufacturing an article according to an embodiment of the present invention is suitable for manufacturing an articles such as a micro-device, which may be a semiconductor device, for example, or an element having a microstructure, for example. The method of manufacturing an article in the present embodiment includes a process of forming a latent image pattern on a photosensitive material applied on a substrate, using the above-described exposure apparatus (i.e., a process of exposing the substrate), and a process of developing the substrate on which the latent image pattern is formed in the aforementioned process. Furthermore, this manufacturing method includes other known processes (oxidation, deposition, evaporation, doping, polishing, etching, resist stripping, dicing, bonding, packaging, etc.). The method of manufacturing an article in the present embodiment is advantageous in at least one of the performance, quality, productivity, and production cost of the article, as compared with conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-268090 filed on Dec. 25, 2013, which is hereby incorporated by reference herein in its entirety.

What is claimed is:

1. An optical apparatus that deforms a reflecting surface of a mirror, comprising:
   a base plate;
   a fixing member configured to fix a part of the mirror, the part including a center of the mirror, to the base plate; and
   a plurality of actuators for deforming the reflecting surface of the mirror,
   wherein each of the plurality of actuators has a first end connected to the mirror and a second end connected to the base plate, and is configured to apply force to a back face on an opposite side of the reflecting surface,
   the plurality of actuators include a plurality of first actuators and a plurality of second actuators for deforming the reflecting surface of the mirror,
   a distance between the first end and the second end of the second actuator changes greater than that of the first actuator when receiving a unit amount of external force, and
   the plurality of first actuators are arranged such that a distance between each first actuator and the center of the mirror is longer than half of a distance between the center of the mirror and a periphery of the mirror.

2. The optical apparatus according to claim 1, wherein the plurality of first actuators and the plurality of second actuators are arranged such that the distance between each first actuator and the center of the mirror is larger than or equal to a largest value among distances between the respective second actuators and the center of the mirror.

3. The optical apparatus according to claim 1, wherein the plurality of first actuators are arranged such that distances between the respective first actuators and the center of the mirror are equal to one another.

4. The optical apparatus according to claim 1, wherein the plurality of first actuators are arranged such that ratios of the distances between the respective first actuators and the center of the mirror to the distance between the center of the mirror and the periphery of the mirror are equal to one another.

5. The optical apparatus according to claim 1, wherein the number of first actuators is smaller than the number of second actuators.

6. The optical apparatus according to claim 1, wherein the plurality of first actuators include four first actuators arranged at an equal angular interval with respect to the center of the mirror.

7. The optical apparatus according to claim 1, further comprising:

a measurement unit configured to measure a shape of the reflecting surface; and a control unit configured to control driving of the first actuators and the second actuators, based on a deviation between the shape of the reflecting surface measured by the measurement unit and a target shape.

8. The optical apparatus according to claim 1, further comprising:

a sensor configured to detect information indicating driving status of each of the plurality of first actuators; and a control unit configured to control driving of the first actuators and the second actuators, based on output from the sensor.

9. The optical apparatus according to claim 1, wherein each first actuator applies force to the back face by deforming so as to change the distance between the first end and the second end thereof.

10. The optical apparatus according to claim 9, wherein each first actuator includes at least one of a piezoelectric actuator, a magnetostrictive actuator, and a screw member.

11. The optical apparatus according to claim 1, wherein each second actuator has a stator and a movable element that do not come into contact with each other, and one of the stator and the movable element is connected to the back face, and the other is connected to the base plate.

12. The optical apparatus according to claim 11, wherein each second actuator includes at least one of a linear motor, an electrostatic actuator, and an electromagnet.

13. An optical apparatus that deforms a reflecting surface of a mirror, comprising:

a base plate;

a fixing member configured to fix a part of the mirror, the part including a center of the mirror, to the base plate; and a plurality of actuators for deforming the reflecting surface of the mirror, wherein each of the plurality of actuators has a first end connected to the mirror and a second end connected to the base plate, and is configured to apply force to a back face on an opposite side of the reflecting surface, the plurality of actuators include a plurality of first actuators and a plurality of second actuators for deforming the reflecting surface of the mirror, a distance between the first end and the second end of the second actuator changes greater than that of the first actuator when receiving a unit amount of external force, and the plurality of first actuators and the plurality of second actuators are arranged such that the distance between each first actuator and the center of the mirror is larger than or equal to a largest value among distances between the respective second actuators and the center of the mirror.

14. A projection optical system that projects a mask pattern onto a substrate, including an optical apparatus that deforms a reflecting surface of a mirror, the optical apparatus comprising:

a base plate;

a fixing member configured to fix a part of the mirror, the part including a center of the mirror, to the base plate; and a plurality of actuators for deforming the reflecting surface of the mirror, wherein each of the plurality of actuators has a first end connected to the mirror and a second end connected to the base plate, and is configured to apply force to a back face on an opposite side of the reflecting surface, the plurality of actuators include a plurality of first actuators and a plurality of second actuators for deforming the reflecting surface of the mirror, a distance between the first end and the second end of the second actuator changes greater than that of the first actuator when receiving a unit amount of external force, and the plurality of first actuators are arranged such that a distance between each first actuator and the center of the mirror is longer than half of a distance between the center of the mirror and a periphery of the mirror.

15. An exposure apparatus that exposes a substrate, including a projection optical system that projects a mask pattern onto a substrate, the projection optical system including an optical apparatus that deforms a reflecting surface of a mirror, the optical apparatus comprising:

a base plate;

a fixing member configured to fix a part of the mirror, the part including a center of the mirror, to the base plate; and a plurality of actuators for deforming the reflecting surface of the mirror, wherein each of the plurality of actuators has a first end connected to the mirror and a second end connected to the base plate, and is configured to apply force to a back face on an opposite side of the reflecting surface, the plurality of actuators include a plurality of first actuators and a plurality of second actuators for deforming the reflecting surface of the mirror, a distance between the first end and the second end of the second actuator changes greater than that of the first actuator when receiving a unit amount of external force, and the plurality of first actuators are arranged such that a distance between each first actuator and the center of the mirror is longer than half of a distance between the center of the mirror and a periphery of the mirror.

16. A method of manufacturing an article, the method comprising:

forming a pattern on a substrate using an exposure apparatus; and processing the substrate, on which the pattern has been formed, to manufacture the article, wherein the exposure apparatus exposes the substrate and includes a projection optical system including an optical apparatus, wherein the optical apparatus deforms a reflecting surface of a mirror and includes:

a base plate;

a fixing member configured to fix a part of the mirror, the part including a center of the mirror, to the base plate; and a plurality of actuators for deforming the reflecting surface of the mirror, wherein each of the plurality of actuators has a first end connected to the mirror and a second end connected to the base plate, and is configured to apply force to a back face on an opposite side of the reflecting surface, the plurality of actuators include a plurality of first actuators and a plurality of second actuators for deforming the reflecting surface of the mirror, a distance between the first end and the second end of the second actuator changes greater than that of the first actuator when receiving a unit amount of external force, and the plurality of first actuators are arranged such that a distance between each first actuator and the center of the mirror is longer than half of a distance between the center of the mirror and a periphery of the mirror.

17. The optical apparatus according to claim 1, wherein the plurality of second actuators includes actuators arranged between the plurality of first actuators in a circumferential direction.

18. The optical apparatus according to claim 1, wherein the plurality of actuators includes second actuators arranged between each of the plurality of first actuators and the fixing member.

19. The optical apparatus according to claim 1, further comprising a control unit configured to control, based on information on a shape of the reflecting surface, the plurality of first actuators and the plurality of second actuators such that the shape of reflecting surface becomes a target shape.

20. The optical apparatus according to claim 1, wherein the fixing member fixes the part of the mirror to the base plate such that the part does not displace to the base plate.

21. A projection optical system that projects a mask pattern onto a substrate, including the optical apparatus according to claim 13.

22. An exposure apparatus that exposes a substrate, including the projection optical system according to claim 20.

23. A method of manufacturing an article, the method comprising:

forming a pattern on a substrate using an exposure apparatus; and processing the substrate, on which the pattern has been formed, to manufacture the article, wherein the exposure apparatus exposes the substrate and includes a projection optical system including an optical apparatus, wherein the optical apparatus deforms a reflecting surface of a mirror and includes:

a base plate;

a fixing member configured to fix a part of the mirror, the part including a center of the mirror, to the base plate; and a plurality of actuators for deforming the reflecting surface of the mirror, wherein each of the plurality of actuators has a first end connected to the mirror and a second end connected to the base plate, and is configured to apply force to a back face on an opposite side of the reflecting surface, the plurality of actuators include a plurality of first actuators and a plurality of second actuators for deforming the reflecting surface of the mirror, a distance between the first end and the second end of the second actuator changes greater than that of the first actuator when receiving a unit amount of external force, and the plurality of first actuators and the plurality of second actuators are arranged such that the distance between each first actuator and the center of the mirror is larger than or equal to a largest value among distances between the respective second actuators and the center of the mirror.

* * * * *